(12) United States Patent
Fujiwara

(10) Patent No.: US 6,642,571 B2
(45) Date of Patent: Nov. 4, 2003

(54) NONVOLATILE SEMICONDUCTOR MEMORY

(75) Inventor: Hideaki Fujiwara, Tsukuba (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/271,556

(22) Filed: Oct. 17, 2002

(65) Prior Publication Data

US 2003/0075757 A1 Apr. 24, 2003

(30) Foreign Application Priority Data

Oct. 18, 2001 (JP) ........................... 2001-320144

(51) Int. Cl.[7] ............................................. H01L 29/788
(52) U.S. Cl. ...................... 257/315; 257/316; 257/317; 257/319
(58) Field of Search ................................. 257/315, 316, 257/317, 319, 321, 314; 438/263, 364, 257, 264, 266, 261, 277, 283

(56) References Cited

U.S. PATENT DOCUMENTS 6,108,242 A * 8/2000 Lin et al. ............... 365/185.33
6,242,308 B1 * 6/2001 Hsieh et al. ................. 438/265
6,313,498 B1 * 11/2001 Chen .......................... 257/316
6,521,944 B1 * 2/2003 Mirgorodski ............... 257/317

* cited by examiner

Primary Examiner—Tom Thomas
Assistant Examiner—Donghee Kang
(74) Attorney, Agent, or Firm—Arent Fox Kintner Plotkin & Kahn, PLLC

(57) ABSTRACT

A semiconductor memory capable of increasing the coupling ratio between a diffusion layer and a floating gate by reducing the coupling ratio between the floating gate and a control gate thereby easily performing high-speed writing with a low diffusion layer voltage is provided. This semiconductor memory comprises the floating gate, a first diffusion layer capacitively coupled with the floating gate for controlling the potential of the floating gate and the control gate arranged oppositely to the floating gate. In an erase operation, the control gate feeds a tunnel current to the floating gate in a direction substantially parallel to the main surface of a semiconductor substrate. Thus, the tunnel current can be fed by extracting carriers from the floating gate also when the control gate has no region overlapping with the upper portion of the floating gate.

16 Claims, 6 Drawing Sheets

NONVOLATILE SEMICONDUCTOR MEMORY

BACKGROUND OF THE INVENTION

1. Field of the Invention

The present invention relates to a semiconductor memory, and more specifically, it relates to a nonvolatile semiconductor memory.

2. Description of the Background Art

A nonvolatile semiconductor memory such as an EPROM (erasable and programmable read only memory) or an EEPROM (electrically erasable and programmable read only memory) has recently been watched with interest as a semiconductor memory substitutional for a magnetic memory such as a hard disk or a floppy disk.

A memory cell of an EPROM or an EEPROM stores carriers in a floating gate electrode for storing data in response to presence/absence of the carriers and reading the data by detecting change of a threshold voltage responsive to presence/absence of the carriers. In particular, the EEPROM includes a flash EEPROM erasing data in the overall memory cell array or dividing the memory cell array into arbitrary blocks and erasing data in units of the blocks. This flash EEPROM, also referred to as a flash memory, can attain a large capacity, low power consumption and a high-speed operation, and is excellent in shock resistance. Therefore, the flash EEPROM is used in various portable devices. Further, memory cells of the flash EEPROM can advantageously be more easily integrated as compared with those of the EEPROM.

In general, a stacked gate memory cell and a split gate memory cell are proposed as memory cells forming a flash EEPROM.

In a write operation of storing electrons in a floating gate of a stacked gate memory cell, electrons stored in a channel of a semiconductor substrate are converted to hot electrons, which in turn are injected into the floating gate electrode. At this time, a voltage of 10-odd V to a control gate electrode. In an erase operation of extracting electrons stored in the floating gate electrode of the stacked gate memory cell, a Fowler-Nordheim tunnel current (hereinafter referred to as an F-N tunnel current) is fed from a source region to the floating gate electrode. At this time, a voltage of 10-odd V must be applied to the source region.

In a write operation of storing electrons in a floating gate electrode of the split gate memory cell, electrons stored in a channel of a semiconductor substrate are converted to hot electrons, which in turn are injected into the floating gate electrode. At this time, a voltage of 10-odd V must be applied to a source region. In an erase operation of extracting electrons from the floating gate electrode of the stacked gate memory cell, an F-N tunnel current is fed from a control gate electrode to the floating gate electrode. At this time, a voltage of 10-odd V must be applied to the control gate electrode.

Thus, hot electrons are employed for injecting electrons into the floating gate electrode in the write operation and the F-N tunnel current is employed for extracting the electrons stored in the floating gate electrode in the erase operation in the conventional stacked or split gate memory cell.

In order to hold the carriers stored in the floating gate electrode over a long period, the thickness of an insulator film enclosing the floating gate electrode must be increased. However, the hot electrons or the F-N current is utilized for injecting or extracting the electrons into or from the floating gate electrode. Therefore, the voltage (hereinafter referred to as an operating voltage for the memory cell) applied to the control gate electrode or the drain region in the write or erase operation must be increased as the thickness of the insulator film enclosing the floating gate electrode is increased.

The operating voltage for the memory cell is generated in a step-up circuit. In this case, a practical voltage is up to 10-odd V. When a silicon oxide film is employed as the insulator film enclosing the floating gate electrode and the operating voltage for the memory cell is set to 10-odd V, however, it is difficult to increase the thickness of the silicon oxide film beyond 10 nm. In general, therefore, the thickness of the silicon oxide film employed as the insulator film enclosing the floating gate electrode is set to not more than 10-odd nm, in order to suppress the operating voltage for the memory cell to 10-odd V. It is known that the electrons stored in the floating gate electrode can be held for a period practically satisfiable to some extent if the thickness of the silicon oxide film is at least 8 nm.

Also when holes are stored in the floating gate electrode, the thickness of the silicon oxide film employed as the insulator film enclosing the floating gate electrode is set to not more than 10-odd nm thereby suppressing the operating voltage for the memory cell to not more than 10-odd V while holding the holes stored in the floating gate electrode for a period practically satisfiable to some extent, similarly to the aforementioned case of storing electrons.

The flash EEPROM is recently required to attain a lower voltage, a higher operating speed, lower power consumption and higher integration while ensuring a sufficiently long holding time (at least 10 years) for carriers stored in the floating gate electrode.

As hereinabove described, the thickness of the silicon oxide film must not be reduced below 8 nm in general, in order to ensure a carrier holding time of at least 10 years when employing the silicon oxide film as the insulator film enclosing the floating gate electrode.

When the operating voltage for the memory cell is reduced, the step-up time (lead time) can be reduced for increasing the speed for a write operation and an erase operation. Further, power consumption can also be reduced.

The circuit scale of the step-up circuit for generating the operating voltage for the memory cell is increased as the level of the generated voltage is increased. An area (transistor size) of a substrate occupied by a transistor forming a peripheral circuit (a decoder, a sense amplifier, a buffer or the like) for the flash EEPROM is increased as the withstand voltage is increased. When the operating voltage for the memory cell is reduced, therefore, the circuit scale of the step-up circuit as well as the size of the transistor forming the step-up circuit are reduced, whereby higher integration can be attained.

Therefore, a high-speed operation, low power consumption and high integration can be simultaneously implemented by reducing the operating voltage for the memory cell.

Also generally known is a split gate flash EEPROM capacitively coupling a source diffusion layer with a floating gate thereby controlling the potential of the floating gate by the potential of the source diffusion layer. According to this structure, the source diffusion layer is capacitively coupled with the floating gate, while a control gate is also capacitively coupled with the floating gate. In this case, the control gate covers the upper portion and the side surface of the floating gate in the structure of the conventional split gate flash EEPROM, leading to large opposite areas of the control gate and the floating gate. Therefore, the coupling ratio between the control gate and the floating gate is increased to some extent. Thus, the coupling ratio between the source diffusion layer and the control gate is relatively reduced, and hence a high voltage must be applied to the source diffusion layer in order to control the potential of the floating gate by the potential of the source diffusion layer. Consequently, it is difficult to reduce the operating voltage in the conventional split gate flash EEPROM controlling the potential of the floating gate by the potential of the source diffusion layer.

SUMMARY OF THE INVENTION

An object of the present invention is to provide a semiconductor memory capable of achieving a high-speed operation, low power consumption and high integration by increasing the life of the semiconductor memory and reducing the voltage therefor.

Another object of the present invention is to increase the coupling ratio between a diffusion layer and a floating gate by reducing the coupling ratio between the floating gate and a control gate in the aforementioned semiconductor memory.

A semiconductor memory according to an aspect of the present invention comprises a floating gate, a first diffusion layer capacitively coupled with the floating gate for controlling the potential of the floating gate and a control gate arranged oppositely to the floating gate. In an erase operation, the control gate feeds a tunnel current to the floating gate in a direction substantially parallel to the main surface of a semiconductor substrate. Throughout the specification, the term "diffusion layer" indicates an impurity region or the like formed on the surface of a semiconductor substrate. The term "semiconductor substrate" indicates a wide concept including not only a general semiconductor substrate but also a semiconductor layer formed on an insulated substrate.

The semiconductor memory according to this aspect is so formed that the control gate feeds the tunnel current to the floating gate in the direction substantially parallel to the main surface of the semiconductor substrate in the erase operation as hereinabove described, whereby the tunnel current can be fed by extracting carriers from the floating gate also when the control gate has no region overlapping with the upper portion of the control gate. Thus, the capacitance between the floating gate and the control gate can be reduced as compared with a structure having a control gate overlapping with the upper portion of a floating gate. Therefore, the coupling ratio between the floating gate and the control gate is reduced, whereby the coupling ratio between the first diffusion layer and the floating gate is increased. Also when a voltage lower than that in the structure having the control gate overlapping with the upper portion of the floating gate is applied to the first diffusion layer, therefore, the potential of the floating gate can be so easily increased that writing can be performed with a low voltage. Further, the step-up time is reduced due to the reduction of the voltage, thereby enabling high-speed writing. In addition, potential difference can be easily attained between the control gate and the floating gate in erasing, whereby sufficient erasing can be performed with a control gate voltage lower than that in the prior art.

In the semiconductor memory according to the aforementioned aspect, the floating gate preferably has an acute forward end in a direction substantially parallel to the main surface of the semiconductor substrate in a portion opposite to the control gate. According to this structure, an electric field can be concentrated to the acute forward end, whereby carriers can be extracted from the floating gate also when a voltage applied to the control gate in erasing is lower than that applied in a case where the floating gate has no acute forward end. Thus, erasing can be performed with a low voltage. Further, a step-up time is reduced due to the reduction of the voltage, thereby enabling high-speed erasing. In addition, the coupling ratio between the floating gate and the control gate is further reduced due to the acute forward end, thereby further increasing the coupling ratio between the first diffusion layer and the floating gate. Thus, the potential of the floating gate can be easily increased also when a voltage lower than that in a structure having no acute shape is applied to the diffusion layer, thereby enabling high-speed writing.

In the semiconductor memory including the floating gate having the aforementioned acute forward end, the acute forward end of the floating gate is preferably formed by isotropic etching. According to this structure, the floating gate can be easily formed with the acute forward end.

In the semiconductor memory including the floating gate having the aforementioned acute forward end, the acute forward end of the floating gate may be located around the lower surface of a side of the floating gate closer to the control gate. The semiconductor memory may further comprise a tunnel insulator film formed between the acute forward end of the floating gate and a portion of the control gate opposite to the acute forward end of the floating gate. Further, a side surface of the floating gate including the acute forward end may be concavely formed. In addition, a portion of the control gate opposite to the acute forward end of the floating gate may be concavely formed.

In the semiconductor memory including the floating gate having the aforementioned acute forward end, the control gate is preferably formed not to overlap with at least a portion of the floating gate other than the acute forward end. According to this structure, the coupling ratio between the control gate and the floating gate can be easily reduced, thereby increasing the coupling ratio between the first diffusion layer and the floating gate.

In the semiconductor memory including the floating gate having the aforementioned acute forward end, a portion of the floating gate other than the acute forward end preferably has a thickness of not more than 50 nm. When the floating gate is formed with such a small thickness, the area of a portion of the floating gate opposite to the control gate is so reduced that the coupling ratio between the floating gate and the control gate can be reduced. Thus, the coupling ratio between the floating gate and the first diffusion layer is increased, whereby writing can be easily performed also when the voltage applied to the first diffusion layer is reduced. Thus, a high-speed operation, low power consumption and high integration can be attained by reducing the voltage.

In the semiconductor memory according to the aforementioned aspect, the floating gate preferably has a thickness of not more than 50 nm. When the floating gate is formed with the extremely small thickness of not more than 50 nm, the overall floating gate can be acutely formed and may not have the acute forward end.

In the semiconductor memory according to the aforementioned aspect, the control gate is preferably formed on the semiconductor substrate through a first insulator film, and an upper surface portion of the semiconductor substrate formed with the first insulator film is preferably dug down beyond an upper surface portion of the semiconductor substrate formed with the floating gate by at least the thickness of the first insulator film and not more than the mean free path of electrons. According to this structure, the side surface, closer to the floating gate, of the control gate substantially perpendicular to the main surface of the semiconductor substrate can reliably cover the acute forward end of the floating gate as a counter electrode. Thus, the voltage applied to the control gate can be further reduced in erasing. When the surface portion of the semiconductor substrate is dug down by the depth not more than the mean free path of electrons, probabilities of generation and injection of hot electrons employed for writing can be prevented from reduction. In this case, the lower surface of the control gate is preferably located downward beyond the lower surface of the floating gate.

In the semiconductor memory according to the aforementioned aspect, the control gate may be formed on the semiconductor substrate through a first insulator film having a first thickness, and the floating gate may be formed on the semiconductor substrate through a second insulator film having a second thickness smaller than the first thickness.

In the semiconductor memory according to the aforementioned aspect, the length of overlapping portions of the floating gate and the first diffusion layer along the gate length direction is preferably not more than half the length of the floating gate along the gate length direction. In the semiconductor memory according to the aforementioned aspect, the coupling ratio between the floating gate and the control gate is so extremely reduced that a sufficiently high coupling ratio can be obtained between the floating gate and the first diffusion layer also when the first diffusion layer capacitively coupled with the floating gate is overlapped with the floating gate by the length not more than half the length of the floating gate along the gate length direction. Therefore, the potential of the floating gate can be controlled in the small voltage range of the first diffusion layer. When the overlapping length of the floating gate and the first diffusion layer is reduced, the distance between the first diffusion layer (source diffusion layer) and a drain diffusion layer is increased beyond that in the prior art, and hence the lengths of the floating gate and the control gate can be reduced thereby easily attaining refinement and a high-speed operation.

In this case, the length of overlapping portions of the floating gate and the first diffusion layer along the gate length direction may be not more than one third of the length of the floating gate along the gate length direction. Further, the coupling ratio between the floating gate and the first diffusion layer is preferably greater than the coupling ratio between the floating gate and the control gate.

The semiconductor memory according to the aforementioned aspect may further comprise a second diffusion layer formed on the main surface of the semiconductor substrate at a prescribed space from the first diffusion layer, and the control gate and the floating gate may be arranged between the first diffusion layer and the second diffusion layer at a prescribed space along a direction parallel to the main surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
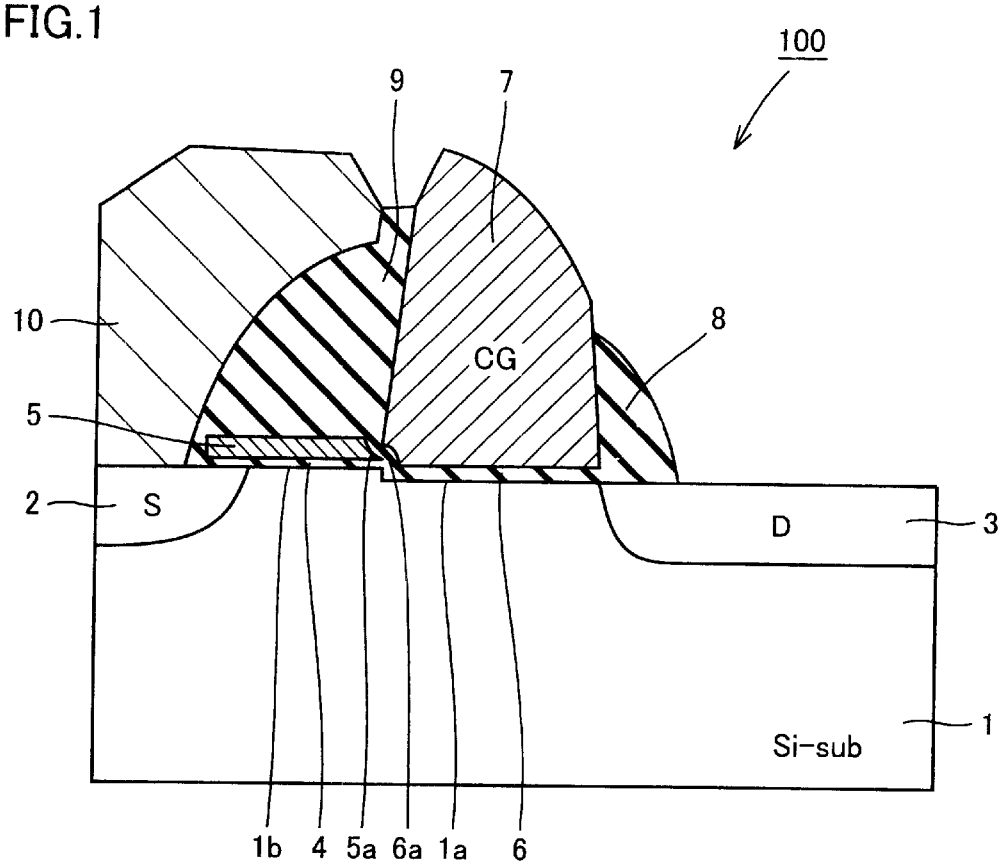
FIG. 1 is a sectional view showing the structure of a memory cell of a semiconductor memory according to an embodiment of the present invention.

An embodiment of the present invention is now described with reference to the drawings.

First, the structure of a memory cell 100 of a semiconductor memory 150 according to the embodiment of the present invention is described with reference to FIGS. 1 and 2. In the semiconductor memory 150 according to the embodiment, a source diffusion layer 2 and a drain diffusion layer 3 are formed on the surface of a silicon substrate 1 at a prescribed space. The silicon substrate 1 is an example of the "semiconductor substrate" according to the present invention, and the source diffusion layer 2 is an example of the "first diffusion layer" according to the present invention. A control gate (CG) 7 consisting of a polysilicon film is formed on a portion, located between the source diffusion layer 2 and the drain diffusion layer 3 and closer to the drain diffusion layer 3, of the silicon substrate 1 through a gate insulator film 6 consisting of a silicon oxide film having a thickness of about 10 nm to about 15 nm. The gate insulator film 6 is an example of the "first insulator film" according to the present invention.

A floating gate (FG) 5 consisting of a polysilicon film having a thickness of about 30 nm is formed on a portion, located between the source diffusion layer 2 and the drain diffusion layer 3 and closer to the source diffusion layer 2, of the silicon substrate 1 through a gate insulator film 4 consisting of a silicon oxide film having a thickness of about 8 nm. A tunnel insulator film 6a consisting of a silicon oxide film is formed between the control gate 7 and a forward end 5a of the floating gate 5.

According to this embodiment, the floating gate 5 is formed with the small thickness of about 30 nm, as hereinabove described. Further, the forward end 5a of the floating gate 5 closer to the control gate 5 has an acute shape. In addition, a surface portion 1a of the silicon substrate 1 located under the control gate 7 and formed with the gate insulator film 6 is dug down beyond a surface portion 1b of the silicon substrate 1 located under the floating gate 5 and formed with the gate insulator film 4 by about 20 nm. The surface portion 1a of the silicon substrate 1 is dug down by an amount exceeding the thickness (about 10 nm to about 15 nm) of the gate insulator film 6 located under the control gate 7 and not more than the mean free path (about 30 nm to about 40 nm) of electrons, for the following reason:

When the surface portion 1a of the silicon substrate 1 is dug down by the amount exceeding the thickness (about 10 nm to about 15 nm) of the gate insulator film 6 located under the control gate 7, the lower surface of the control gate 7 is located downward beyond that of the floating gate 5. Thus, the side surface, closer to the floating gate 5, of the control gate 7 substantially perpendicular to the main surface of the silicon substrate 1 can reliably cover the acute forward end 5a of the floating gate 5 as a counter electrode. Consequently, a voltage applied to the control gate 7 can be reduced in an erase operation described later. When the surface portion 1a is dug down by the amount not more than the mean free path of electrons, probabilities of generation and injection of hot electrons employed for writing can be prevented from reduction.

According to this embodiment, electrons are extracted from the forward end 5a of the floating gate 5 toward the control gate 7 in a direction substantially parallel to the main surface of the silicon substrate 1 in the erase operation described later. Further, the length of overlapping portions of the source diffusion layer 2 and the floating gate 5 along the gate length direction is about one third of the length of the floating gate 5 along the gate length direction.

Figure 2:
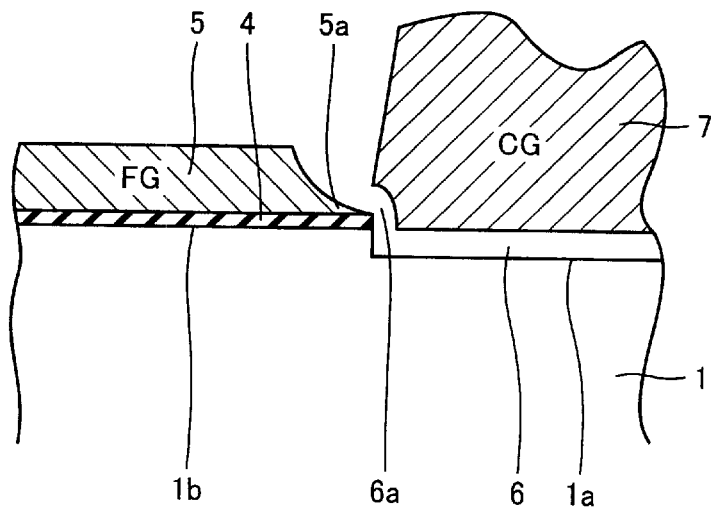
FIG. 2 is a partially enlarged sectional view of the memory cell according to the embodiment shown in FIG. 1.

In the structure shown in FIG. 1, an interlayer dielectric film 9 is formed to cover the floating gate 5. Further, a side wall insulator film 8 is formed to partially cover the side surface, closer to the drain diffusion layer 3, of the control gate 7. In addition, a source electrode 10 is formed to be connected to the source diffusion layer 2.

Figure 3:
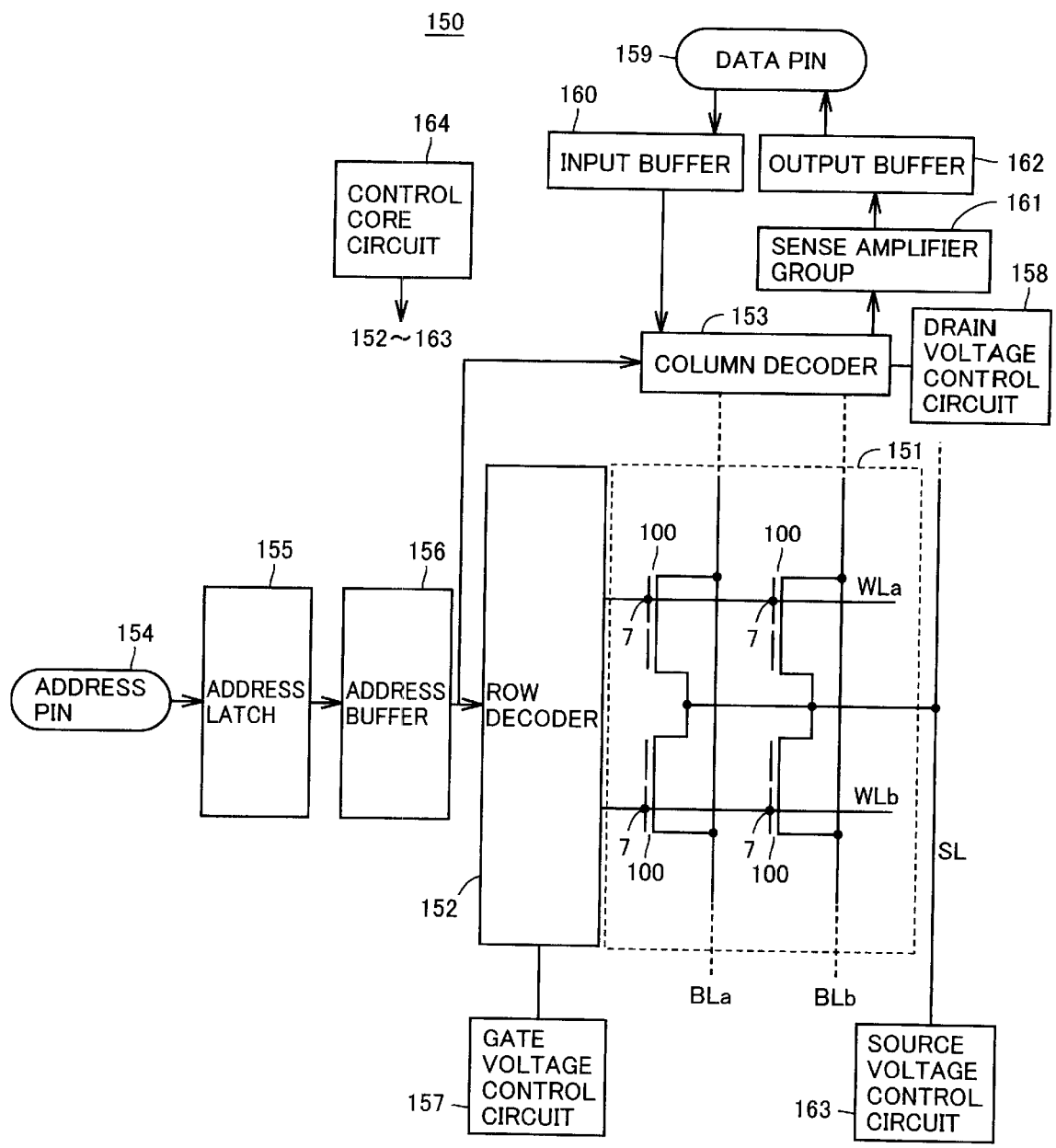
FIG. 3 is a block diagram showing the overall structure of the semiconductor memory according to the embodiment of the present invention.

The overall structure of the semiconductor memory 150 is now described with reference to FIG. 3. A plurality of memory cells 100 are arranged in the form of a matrix, to form a memory cell array 151 (FIG. 3 shows only four memory cells 100, in order to simplify the illustration).

In the memory cells 100 arranged in a row direction, the control gates 7 are connected to common word lines $WL_1$ to $WL_n$. In the memory cells 100 arranged in a column direction, the drain diffusion layers 3 are connected to common bit lines $BL_1$ to $BL_n$, and the source electrodes 10 are connected to a common source line SL.

The word lines $WL_1$ to $WL_n$ are connected to a row decoder 152, and the bit lines $BL_1$ to $BL_n$ are connected to a column decoder 153.

Externally specified row and column addresses are input in an address pin 154, which in turn transfers the row and column addresses to an address latch 155. In the addresses latched in the address latch 155, the row address is transferred to the row decoder 152 through an address buffer 156, and the column address is transferred to the column decoder 153 through the address buffer 156.

The row decoder 152 selects a word line corresponding to the row address latched in the address latch 155 from the word lines $WL_1$ to $WL_n$, and controls the potentials of the word lines $WL_1$ to $WL_n$ in correspondence to each operation mode described later on the basis of a signal from a gate voltage control circuit 157.

The column decoder 153 selects a bit line corresponding to the column address latched in the address latch 155 from the bit lines $BL_1$ to $BL_n$, and controls the potentials of the bit lines $BL_1$ to $BL_n$ in correspondence to each operation mode described later on the basis of a signal from a drain voltage control circuit 158.

Externally specified data is input in a data pin 159, which in turn transfers the data to the column decoder 153 through an input buffer 160. The column decoder 153 controls the potentials of the bit lines $BL_1$ to $BL_n$ in correspondence to the data as described later.

Data read from an arbitrary memory cell 100 is transferred to a sense amplifier group 161 from the bit lines $BL_1$ to $BL_n$ through the column decoder 153. The sense amplifier group 161 is formed by current sense amplifiers. The data determined by the sense amplifier group 161 is output from an output buffer 162 through the data pin 159.

A source voltage control circuit 163 controls the potential of the source line SL in correspondence to each operation mode described later.

A control core circuit 164 controls the operations of the aforementioned circuits 152 to 163.

The operations (a write operation, the erase operation and a read operation) of the memory cell 100 having the aforementioned structure are now described. A source voltage Vs is applied to the source diffusion layer 2 (the source electrode 10) through the source line SL. A drain voltage Vd is applied to the drain diffusion layer 3 through the bit lines $BL_1$ to $BL_n$. A control gate voltage Vcg is applied to the control gate 7 through the word lines $WL_1$ to $WL_n$.

(Write Operation)

Before the write operation, the floating gate 5 is in an erased state (a state where electrons are extracted), and keeps a potential of about 2 V according to this embodiment. In this embodiment, it is assumed that threshold voltages Vt of transistors having the floating gate 5 and the control gate 7 respectively are 0.5 V.

In the write operation, operating voltages for the memory cell 100, i.e., the source voltage Vs, the drain voltage Vd and the control gate voltage Vcg are set to 7 V, 0.3 V and 1 V respectively.

The source diffusion layer 2 and the floating gate 5 are strongly capacitively coupled with each other as hereinabove described, and hence the potential of the floating gate 5 can be easily increased also when the source diffusion layer 2 is set to the relatively low voltage of 7 V. Thus, the transistor having the floating gate 5 is turned on. The voltage of 1 V is applied to the control gate 7, whereby the transistor having the control gate 7 is also turned on. Thus, electrons flow from the drain diffusion layer 3 toward the source diffusion layer 2 and are accelerated by a step portion located between the control gate 7 and the floating gate 5 to be converted to hot electrons, which in turn are injected into the floating gate 5.

According to this embodiment, as hereinabove described, the floating gate 5 is formed with the small thickness of about 30 nm while the forward end 5a, closer to the control gate 7, of the floating gate 5 is acutely formed, whereby the capacitance between the floating gate 5 and the control gate 7 can be reduced. Thus, the coupling ratio between the control gate 7 and the floating gate 5 is reduced thereby increasing the coupling ratio between the source diffusion layer 2 and the floating gate 5. Consequently, the potential of the floating gate 5 can be easily increased also when a low voltage is applied to the source diffusion layer 2 in the write operation, whereby writing can be performed with a low voltage. Further, the step-up time is reduced due to the reduction of the voltage, thereby enabling high-speed writing.

According to this embodiment, further, the floating gate 5 is formed with the small thickness of about 30 nm and the forward end 5a, closer to the control gate 7, of the floating gate 5 is acutely formed thereby extremely reducing the coupling ratio between the floating gate 5 and the control gate 7. Also when the source diffusion layer 2 capacitively coupled with the floating gate 5 is overlapped with the floating gate 5 by about one third of the length of the floating gate 5 along the gate length direction, therefore, a sufficiently high coupling ratio can be obtained between the floating gate 5 and the source diffusion layer 2. Therefore, the potential of the floating gate 5 can be controlled in the small voltage range of the source diffusion layer 2. Further, the length of the overlapping portions of the floating gate 5 and the source diffusion layer 2 is reduced for increasing the distance between the source diffusion layer 2 and the drain diffusion layer 3 beyond that in the prior art, whereby the lengths of the floating gate 5 and the control gate 7 can be reduced and the semiconductor memory 150 can be easily refined.

The gate insulator film 4 located under the floating gate 5, which is formed with a thickness similar to that in the prior art, can hold data over a long period. According to this embodiment, further, low power consumption can also be attained by reducing the operating voltages as hereinabove described. In addition, the circuit scale of the step-up circuit as well as the sizes of transistors forming peripheral circuits are reduced due to the reduction of the operating voltages, whereby the semiconductor memory 150 can also be highly integrated.

(Erase Operation)

In the erase operation, the operating voltages for the memory cell 100, i.e., the source voltage Vs, the drain voltage Vd and the control gate voltage Vcg are set to 0 V, 0 V and 8 V respectively. In this case, the source diffusion layer 2 and the floating gate 5 are strongly capacitively coupled with each other while the control gate 7 and the floating gate 5 are weakly coupled with each other, whereby the potential of the floating gate 5 is substantially 0 V.

On the other hand, the potential of the control gate 7 is 8 V, and hence a high electric field is generated in the tunnel insulator film 6a located between the control gate 7 and the acute forward end 5a of the floating gate 5. Consequently, an F-N tunnel current flows and electrons are extracted from the floating gate 5 to the control gate 7, to erase data. In this case, the electrons are extracted from the acute forward end 5a of the floating gate 5 to the control gate 7 in a direction substantially parallel to the main surface of the silicon substrate 1. Therefore, the F-N tunnel current also flows in a direction substantially parallel to the main surface of the silicon substrate 1.

According to this embodiment, the floating gate 5 is provided with the acute forward end 5a so that field concentration takes place on the acute forward end 5a, whereby electrons can be easily extracted from the floating gate 5 also when the voltage applied to the control gate 7 in erasing is lower than that in a case where the floating gate 5 has no acute shape. Thus, the erase operation can be easily performed with a voltage lower than that in the structure having no acute shape. Further, the step-up time is reduced due to the reduction of the voltage, whereby the erase operation can be performed at a high speed.

(Read Operation)

In the read operation, the operating voltages for the memory cell 100, i.e., the source voltage Vs, the drain voltage Vd and the control gate voltage Vcg are set to 0 V, 2.5 V and 2.5 V respectively.

When storing no electrons (in the erased state), the floating gate 5 is positively charged and hence the channel region located under the floating gate 5 is turned on. When storing electrons (in a written state), the floating gate 5 is negatively charged and hence the channel region located under the floating gate 5 is turned off.

When the channel region is on, a current more readily flows between the source diffusion layer 2 and the drain diffusion layer 3 as compared with an off state of the channel region. Therefore, whether or not the floating gate 5 stores electrons can be determined by detecting the amount of the current (cell current) flowing between the source diffusion layer 2 and the drain diffusion layer 3. Thus, data stored in the memory cell 100 can be read.

A fabrication process for the memory cell part of the semiconductor memory 150 according to this embodiment is now described with reference to FIGS. 1 and 4 to 10.

Figure 4:
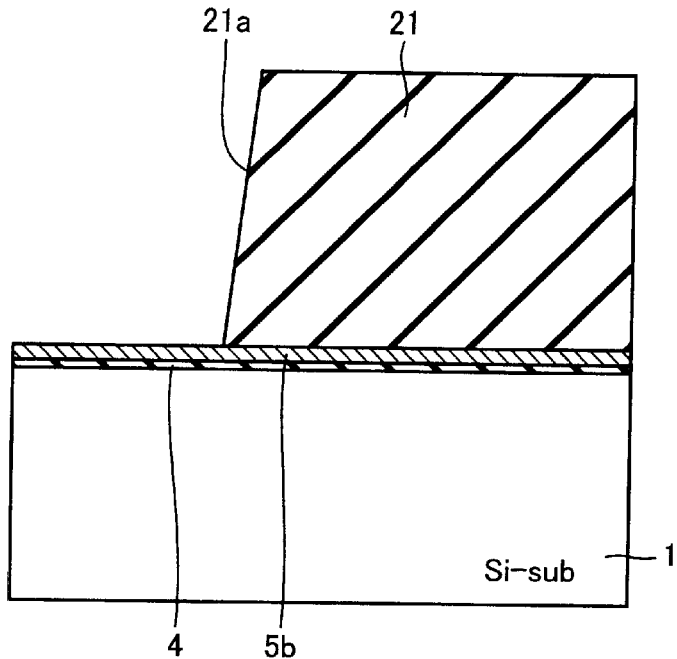
FIGS. 4 to 10 are sectional views for illustrating a fabrication process for the semiconductor memory shown in FIG. 1.

First, the gate insulator film 4 consisting of a silicon oxide film is formed on the silicon substrate 1, and a polysilicon film 5b having a thickness of about 30 nm is formed on the gate insulator film 4, as shown in FIG. 4. An SiN film 21 is deposited on the polysilicon film 5b and partially removed from regions for forming the source diffusion layer 2 and the floating gate 5, thereby forming an opening 21a. The SiN film 21 having the opening 21a is employed as a mask for doping the polysilicon film 5b with an impurity.

Figure 5:
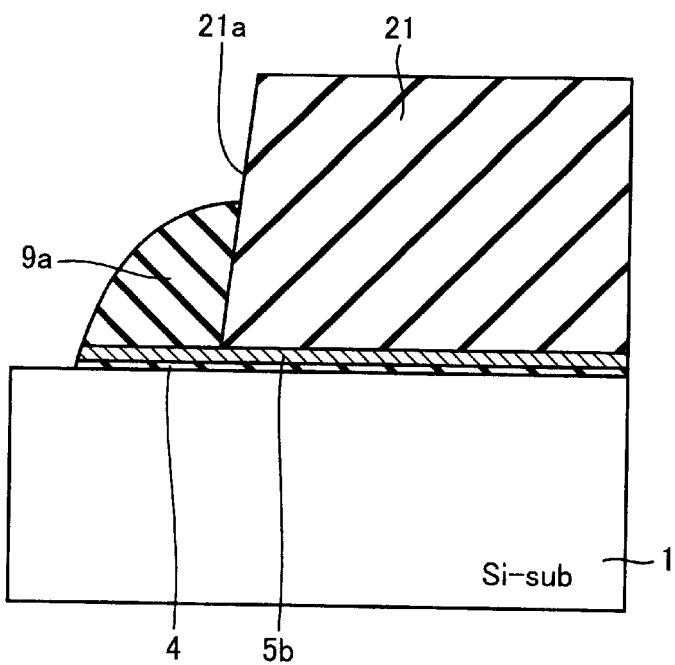

Thereafter a silicon oxide film ($SiO_2$ film) 9a is formed in the opening 21a of the SiN film 21, as shown in FIG. 5. The polysilicon film 5b is partially removed by etching.

Figure 6:
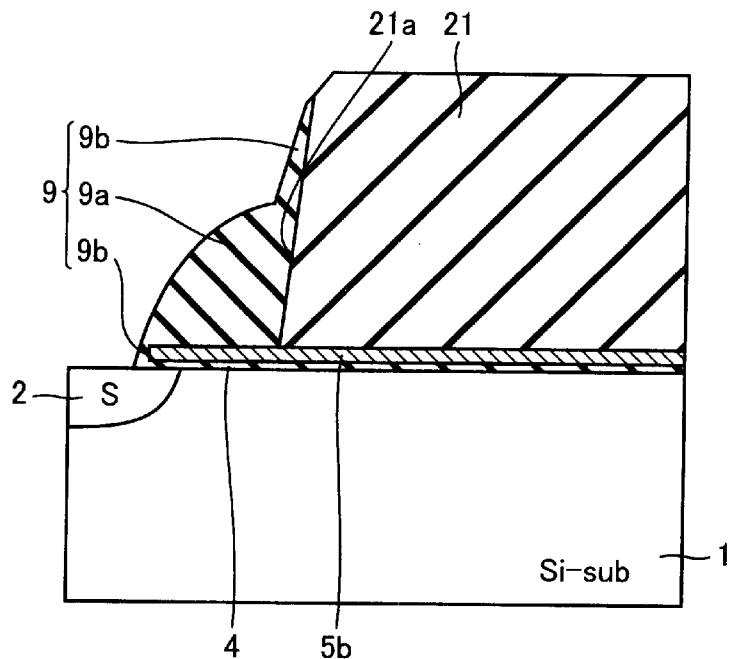

As shown in FIG. 6, a silicon oxide film ($SiO_2$ film) is deposited on the overall surface and etched back thereby forming an insulator film 9b covering an end of the polysilicon film 5b as well as an upper portion of the side wall of the SiN film 21. A side wall spacer 9a and the insulator film 9b form the interlayer dielectric film 9.

Figure 7:
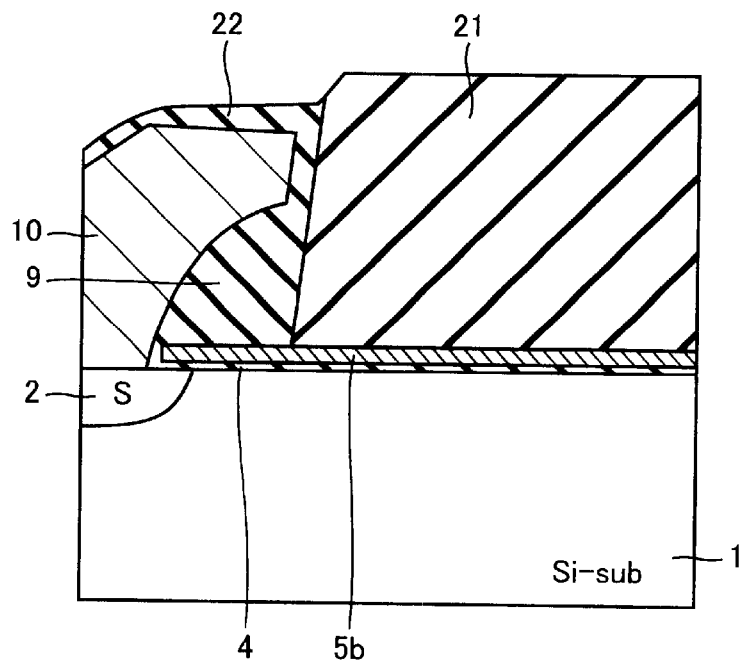

As shown in FIG. 7, ions are implanted for forming the source diffusion layer 2, followed by formation of the source electrode 10 consisting of polysilicon. The source electrode 10 consisting of polysilicon is formed to be columnar along the depth direction of FIG. 7. The source electrode 10 consisting of polysilicon is doped with arsenic (As) or phosphorus (P) so that the average impurity concentration thereof is at least $1\times10^{20}$ $cm^{-3}$. Thereafter a silicon oxide film 22 is formed on the upper surface of the source electrode 10 consisting of polysilicon.

Figure 8:
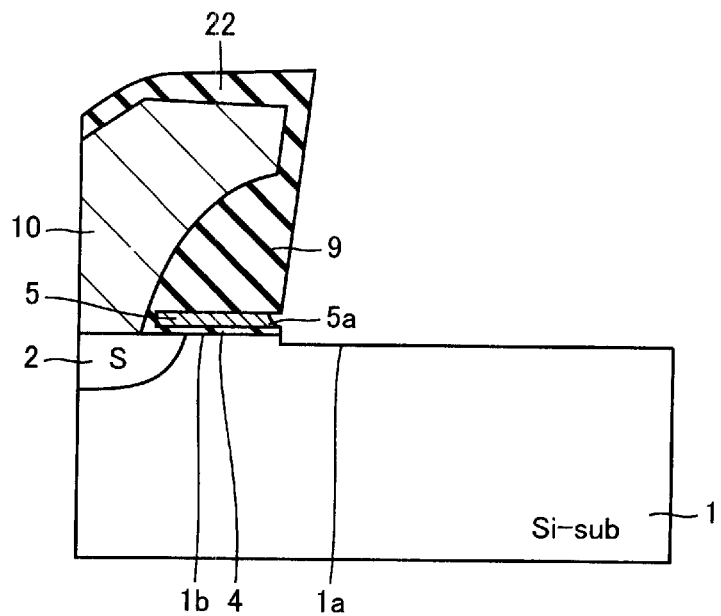
Figure 9:
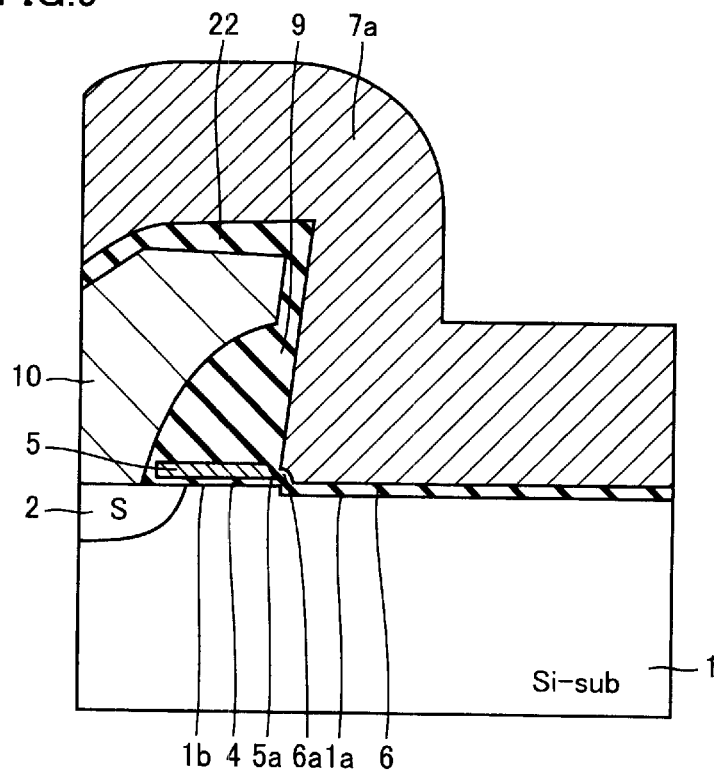

Thereafter the SiN film 21 is removed by etching and the exposed polysilicon film 5b (see FIG. 7) is isotropically etched thereby forming the floating gate 5 having the rightwardly acute forward end 5a as shown in FIG. 8. The portion of the gate insulator film 4 located under the polysilicon film 5b (see FIG. 7) is removed by isotropic etching, and thereafter the silicon substrate 1 is cut by about 20 nm. Thus, the surface portion 1a of the silicon substrate 1 is dug down.

Thereafter a silicon oxide film for forming the gate insulator film 6 and the tunnel insulator film 6a is deposited, followed by deposition of a polysilicon film 7a with a thickness of about 200 nm. The polysilicon film 7a is doped with arsenic (As) or phosphorus (P), so that the average impurity concentration thereof is at least $1\times10^{20}$ $cm^{-3}$.

Figure 10:
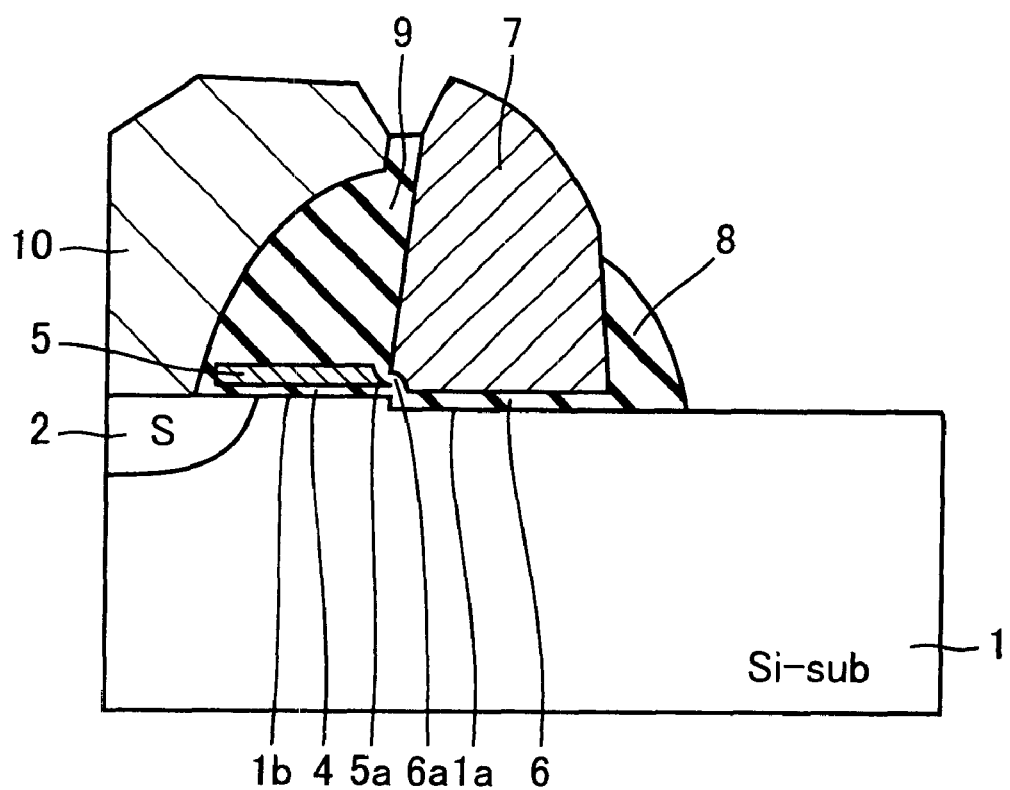

Thereafter the polysilicon film 7a is anisotropically etched thereby forming the control gate 7 consisting of polysilicon as shown in FIG. 10. A silicon oxide film is deposited and anisotropically etched thereby forming the insulator film 8 on the side surface of the control gate 7.

Finally, arsenic (As) or phosphorus (P) is ion-implanted into the silicon substrate 1, thereby forming the drain diffusion layer 3 as shown in FIG. 1. Thereafter an upper structure and a wiring part are formed thereby completing the memory cell 100 of the semiconductor memory 150 according to this embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the floating gate 5 has the acute forward end 5a in the aforementioned embodiment, the present invention is not restricted to this but a similar effect can be attained without providing the acute forward end 5a when further reducing the thickness of the floating gate 5. While the thickness of the floating gate 5 is set to about 30 nm in the aforementioned embodiment, the present invention is not restricted to this but a similar effect can be attained so far as the thickness of the floating gate 5 is not more than 50 nm.

While the surface portion 1a of the silicon substrate 1 formed with the gate insulator film 6 located under the control gate 7 is dug down by about 20 nm in the aforementioned embodiment, the present invention is not restricted to this but the surface portion 1a may alternatively be dug down by another amount so far as the depth thereof is in excess of the thickness of the gate insulator film 6 and not more than the mean free path (30 nm to 40 nm) of electrons.

While the length of the overlapping portions of the source diffusion layer 2 and the floating gate 5 along the gate length direction is set to about one third of the length of the floating gate 5 along the gate length direction in the aforementioned embodiment, the present invention is not restricted to this but the former may be not more than half the latter. However, the former is preferably not more than one third of the latter.

What is claimed is:

1. A semiconductor memory comprising:

a floating gate;

a first diffusion layer capacitively coupled with said floating gate for controlling the potential of said floating gate; and a control gate arranged oppositely to said floating gate, wherein said control gate feeds a tunnel current to said floating gate in a direction substantially parallel to the main surface of a semiconductor substrate in an erase operation, and the control gate does not overlap an oblique portion of the floating gate except for an acute forward end of the floating gate.

2. The semiconductor memory according to claim 1, wherein said acute forward end is in a direction substantially parallel to the main surface of said semiconductor substrate in a portion opposite to said control gate.

3. The semiconductor memory according to claim 2, wherein said acute forward end of said floating gate is formed by isotropic etching.

4. The semiconductor memory according to claim 2, wherein said acute forward end of said floating gate is located around the lower surface of side of said floating gate closer to said control gate.

5. The semiconductor memory according to claim 2, further comprising a tunnel insulator film formed between said acute forward end of said floating gate and a portion of said control gate opposition to said acute forward end of the said floating gate.

6. The semiconductor memory according to claim 2, wherein a side surface of said floating gate including said acute forward end is concavely formed.

7. The semiconductor memory according to claim 2, wherein a portion of said control gate opposite to said acute forward end of said floating gate is concavely formed.

8. The semiconductor memory according to claim 2, wherein a portion of said floating gate other than said acute forward end has thickness of not more than 50 nm.

9. The semiconductor memory according to claim 1, wherein said control gate is formed on said semiconductor substrate through a first insulator film, and an upper surface portion of said semiconductor substrate formed with said first insulator film is dug down beyond an upper surface portion of said semiconductor substrate formed with said floating gate by at least the thickness of said first insulator film and not more than the mean free path of electrons.

10. The semiconductor memory according to claim 1, wherein said control gate is formed on said semiconductor substrate through a first insulator film, and an upper surface portion of said semiconductor substrate formed with said first insulator film is dug down beyond an upper surface portion of said semiconductor substrate formed with said floating gate by a least the thickness of said first insulator film and not more than the mean free path of electrons.

11. The semiconductor memory according to claim 10, wherein the lower surface of said control gate is located downward beyond the lower surface of said floating gate.

12. The semiconductor memory according to claim 1, wherein said control gate is formed on said semiconductor substrate through a first insulator film having a first thickness and said floating gate is formed on said semiconductor substrate through a second insulator film having a second thickness smaller than said first thickness.

13. The semiconductor memory according to claim 1, wherein the length of overlapping portions of said floating gate and said first diffusion layer along the gate length direction is not more than half the length of said floating gate along the gate length direction.

14. The semi conductor memory according to claim 13, wherein the coupling ratio between said floating gate and said first diffusion layer is greater than the coupling ratio between said floating gate and said control gate.

15. The semiconductor memory according to claim 1, wherein the length of overlapping portions of said floating gate and said first diffusion layer along the gate length direction is not more than one third of the length of said floating gate along the gate length direction.

16. The semiconductor memory according to claim 1, further comprising a second diffusion layer formed on the main surface of said semiconductor substrate at a prescribed space from said first diffusion layer, wherein said control gate and said floating gate are arranged between said first diffusion layer and said second diffusion layer at a prescribed space along a direction parallel to the main surface of said semiconductor substrate.

* * * * *